(12) United States Patent
Anderson et al.

(10) Patent No.: US 9,786,656 B1
(45) Date of Patent: Oct. 10, 2017

(54) INTEGRATION OF BIPOLAR TRANSISTOR INTO COMPLIMENTARY METAL-OXIDE-SEMICONDUCTOR PROCESS

(71) Applicant: International Business Machines Corporation, Armonk, NY (US)

(72) Inventors: Brent A. Anderson, Jericho, VT (US); Xuefeng Liu, Schenectady, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/241,348

(22) Filed: Aug. 19, 2016

(51) Int. Cl.
| | |
|---|---|
| H01L 21/8222 | (2006.01) |
| H01L 27/06 | (2006.01) |
| H01L 29/66 | (2006.01) |
| H01L 21/8249 | (2006.01) |
| H01L 29/08 | (2006.01) |
| H01L 29/06 | (2006.01) |
| H01L 29/165 | (2006.01) |
| H01L 29/167 | (2006.01) |
| H01L 21/02 | (2006.01) |
| H01L 21/306 | (2006.01) |
| H01L 29/45 | (2006.01) |
| H01L 29/78 | (2006.01) |
| H01L 29/737 | (2006.01) |

(52) U.S. Cl.
CPC .... *H01L 27/0623* (2013.01); *H01L 21/02532* (2013.01); *H01L 21/30604* (2013.01); *H01L 21/8249* (2013.01); *H01L 29/0657* (2013.01); *H01L 29/0817* (2013.01); *H01L 29/0821* (2013.01); *H01L 29/165* (2013.01); *H01L 29/167* (2013.01); *H01L 29/456* (2013.01); *H01L 29/66242* (2013.01); *H01L 29/66795* (2013.01); *H01L 29/7371* (2013.01); *H01L 29/7851* (2013.01)

(58) Field of Classification Search
CPC ............................................... H01L 21/823821
See application file for complete search history.

(56) References Cited

U.S. PATENT DOCUMENTS

| | | | |
|---|---|---|---|
| 6,235,567 B1 | 5/2001 | Huang | |
| 6,288,427 B2 | 9/2001 | Huang | |
| 6,670,228 B2 | 12/2003 | Coolbaugh et al. | |

(Continued)

FOREIGN PATENT DOCUMENTS

TW   200428641 A   12/2004

*Primary Examiner* — Zandra Smith
*Assistant Examiner* — Andre' C Stevenson
(74) *Attorney, Agent, or Firm* — Cantor Colburn LLP

(57) ABSTRACT

A fin heterojunction bipolar transistor (fin HBT) and a method of fabricating the fin HBT for integration with a fin complimentary metal-oxide-semiconductor (fin CMOS) into a BiCMOS fin device include forming a sub-collector layer on a substrate. The sub-collector layer includes silicon doped with arsenic (As+). A collector layer and base are patterned as fins along a first direction. An emitter layer is formed on the fins. The emitter layer is a continuous layer of epitaxially grown silicon. An oxide is deposited above the sub-collector layer, the base, and the emitter layer, and at least one contact is formed through the oxide to each of the sub-collector layer, the base, and the emitter layer.

20 Claims, 19 Drawing Sheets

(56) References Cited

U.S. PATENT DOCUMENTS

| | | | |
|---|---|---|---|
| 6,800,921 B1 | 10/2004 | Coolbaugh et al. | |
| 7,705,426 B2 | 4/2010 | Voldman | |
| 7,718,486 B2 | 5/2010 | Krutko et al. | |
| 7,834,403 B2 | 11/2010 | Kakoschke et al. | |
| 8,183,120 B2 | 5/2012 | Kakoschke et al. | |
| 9,293,378 B2 * | 3/2016 | Fan | H01L 29/66136 |
| 2001/0008284 A1 | 7/2001 | Huang | |
| 2006/0060941 A1 * | 3/2006 | Sun | H01L 29/0821 |
| | | | 257/557 |
| 2015/0287642 A1 | 10/2015 | Chang et al. | |

* cited by examiner

US 9,786,656 B1

INTEGRATION OF BIPOLAR TRANSISTOR INTO COMPLIMENTARY METAL-OXIDE-SEMICONDUCTOR PROCESS

BACKGROUND

The present invention relates to bipolar transistor fabrication, and more specifically, to integration of a bipolar transistor into the complimentary metal-oxide-semiconductor (CMOS) process.

A system-on-a-chip (SoC) is an integrated circuit that includes all the components needed for a system (e.g., computer). The SoC can include one or more central processors and co-processors, graphics drivers, memory, power management circuits, wireless communication interfaces, and other parts of a fully functional system. Building the various components on the same wafer can reduce packaging and system costs. Further, because the signals among the various components are kept on-die, power requirements of the system can be reduced.

SUMMARY

According to one or more embodiments of the present invention, a method of fabricating a fin heterojunction bipolar transistor (fin HBT) for integration with a fin complimentary metal-oxide-semiconductor (fin CMOS) into a BiCMOS fin device includes forming a sub-collector layer on a substrate, the sub-collector layer of the bipolar transistor of the BiCMOS fin device comprising silicon doped with arsenic (As+). The method also includes patterning a collector layer and base as fins along a first direction, the base of the bipolar transistor of the BiCMOS fin device comprising silicon germanium (SiGe) or silicon germanium carbide (SiGeC) and forming an emitter layer on the fins. The emitter layer of the bipolar transistor of the BiCMOS fin device is a continuous layer of epitaxially grown silicon. An oxide is deposited above the sub-collector layer, the base, and the emitter layer, and at least one contact is formed through the oxide to each of the sub-collector layer, the base, and the emitter layer.

According to one or more embodiments, a fin heterojunction bipolar transistor (fin HBT) integrated with a fin complimentary metal-oxide-semiconductor (fin CMOS) into a BiCMOS fin device includes a sub-collector layer formed on a substrate. The sub-collector layer includes silicon doped with arsenic (As+). The transistor also includes a collector layer and a base patterned as fins along a first direction. The base includes silicon germanium (SiGe) or silicon germanium carbide (SiGeC). An emitter layer is formed on the fins and includes epitaxially grown silicon. At least one contact is formed above each of the sub-collector layer, the base, and the emitter layer.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-20 show views of intermediate structures used in the fabrication of a bipolar transistor of a BiCMOS fin device, in which:

FIG. 1 shows a sub-collector and collector formed on a substrate;

FIG. 2 results from forming a base on the collector;

FIG. 3 is a cross-sectional view showing a fin hardmask formed on the base;

FIG. 4 is an intermediate structure that includes the fins and a top view indicating the cross-sectional view across the fins;

FIG. 5 shows the result of depositing an oxide on the intermediate structure shown in FIG. 4;

FIG. 6 shows a lithographic mask formed on the fins and most of the oxide;

FIG. 7 shows a result of patterning the oxide using the lithographic mask;

FIG. 8 is a cross-sectional view across the fins of an intermediate structure that results from a strip of the mask and a silicidation of the sub-collector exposed by the etch of the oxide;

FIG. 9 results from an oxide fill of the structure shown in FIG. 8;

FIG. 10 shows a top view and a cross-sectional view across the fins following an oxide recess and removal of the hardmask;

FIG. 11 is a cross-sectional view across the fins following the formation of an emitter layer;

FIG. 12 is a cross-sectional view along a fin following the deposition of a mask on a portion of the emitter;

FIG. 13 is a cross-sectional view along a fin showing a portion of the emitter etched;

FIG. 14 shows an oxide spacer formed over the patterned emitter and exposed base;

FIG. 15 shows the result of etching the spacer;

FIG. 16 is a cross-sectional view along a fin that shows an intermediate structure resulting from deposition of oxide as an interlayer dielectric;

FIG. 17 is a cross-sectional view along a fin of an intermediate structure that shows contacts formed on the emitter and base;

FIG. 18 is a cross-sectional view across the fins of the same structure as the one shown in FIG. 17 and shows contacts formed on the emitter and collector;

FIG. 19 is a top view of the same structure shown in FIGS. 17 and 18; and

FIG. 20 is a top view of another embodiment of the structure shown in FIG. 19.

DETAILED DESCRIPTION

As previously noted, building the various components of a system in a SoC configuration can result in reduced cost and power usage. A silicon germanium (SiGe) heterojunction bipolar transistor (HBT) and CMOS can be combined as a BiCMOS, for example. The BiCMOS is widely used in radio frequency (RF) circuits for wireless and WiFi communications, for example. Specifically, SiGe:C HBTs can maximize the performance of RF circuits. In prior SoCs, the SiGe HBT has been integrated with a planar CMOS. However, fin-based CMOS technologies, rather than planar CMOS technologies, are increasingly preferred in applications such as, for example, cell phones and tablet devices. As a result, integration of SiGe or SiGe:C HBTs with fin CMOS devices (i.e., fabricating BiCMOS fin technologies) is desired.

A known approach to obtaining a fin bipolar device includes using a sectional fin region to define the base and using a side gate for the base contact. However, this increases the base width because of the area required for the based contact. Also, the Ge concentration of the SiGe base must be limited to avoid a treading misfit dislocation that shorts the collector to the emitter. This limitation on Ge concentration negatively affects performance of the fin bipolar device.

Another known approach includes a deposited base for a bipolar transistor. The base is formed by ion-implantation and relies on rapid thermal annealing (RTA) to diffuse the dopant to form the base. However, the diffused base width cannot be controlled and results in a wide base. Also, SiGe HBT is not specifically considered as a base. Thus, bipolar performance is expected to be poor and not suitable for X-band and beyond cutoff frequencies, which are of interest in 5G technology.

Turning now to an overview of the present invention, one or more embodiments relate to a SiGe or SiGe:C HBT that can be integrated with fin CMOS technology to form a fin-based BiCMOS. Both lateral or horizontal CMOS devices, which exhibit lateral current flow, and vertical CMOS devices, which exhibit vertical current flow, can be integrated with the HBT device that is fabricated as detailed herein. The SiGe:C thickness can be well controlled to an order of 30 nanometers thickness with a Ge concentration as high as 60%. Low base resistance is achieved by wrapping the base contact around the desired region via epitaxy. The emitter is a polysilicon silicon deposition abutted to the multi-fin base so that the emitter area includes area for a contact and reduces the emitter resistance.

Figure 1:
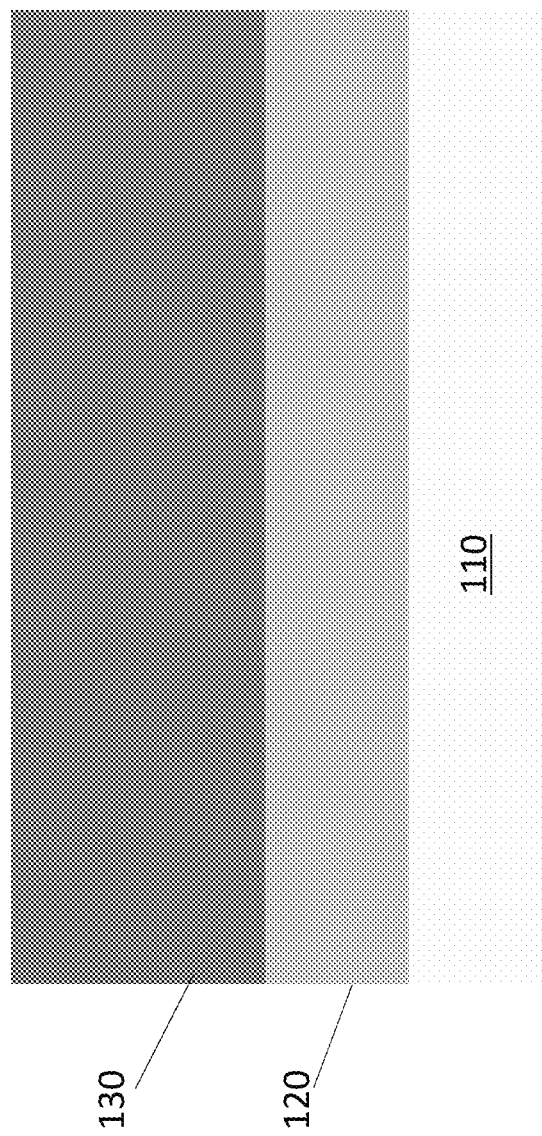

Turning now to a more detailed description of one or more embodiments, FIGS. 1-20 illustrate processes involved in the formation of an HBT for a fin-based BiCMOS. FIG. 1 shows an intermediate structure that includes a collector 130 formed on a sub-collector 120, which is formed on a substrate 110. The substrate 110 is a silicon (Si) substrate. The sub-collector 120 is a heavily doped region. Doping involves ion implantation and annealing. The doping of the collector 130 and sub-collector 120 is achieved by ion implantation and annealing, for example. The heavily doped sub-collector 120 may be implanted with As+ and, optionally, antimony (Sb) with a concentration of $2e^{19}$ to $1e^{20}$ cm$^{-3}$. The collector 130 is a lightly doped region according to one embodiment and is doped with arsenic (As+) ions with a concentration of $1e^{17}$ to $5e^{18}$ centimeters$^{-3}$ (cm$^{-3}$).

In an alternate embodiment, the collector 130 is heavily doped and can have a doping concentration equivalent to that of the sub-collector 120. When the collector 130 doping concentration increases, the performance of the resulting device increases, but the breakdown voltage decreases (i.e., the device breaks down at a lower voltage such that it cannot be operated at very high voltages). When the collector 130 doping concentration decreases, the performance of the resulting device decreases, but the breakdown voltage increases (i.e., the device breaks down at a higher voltage and, thus, can be operated at higher voltages). The doping concentration of the collector 130 is therefore balanced to account for both performance and breakdown voltage.

Figure 2:
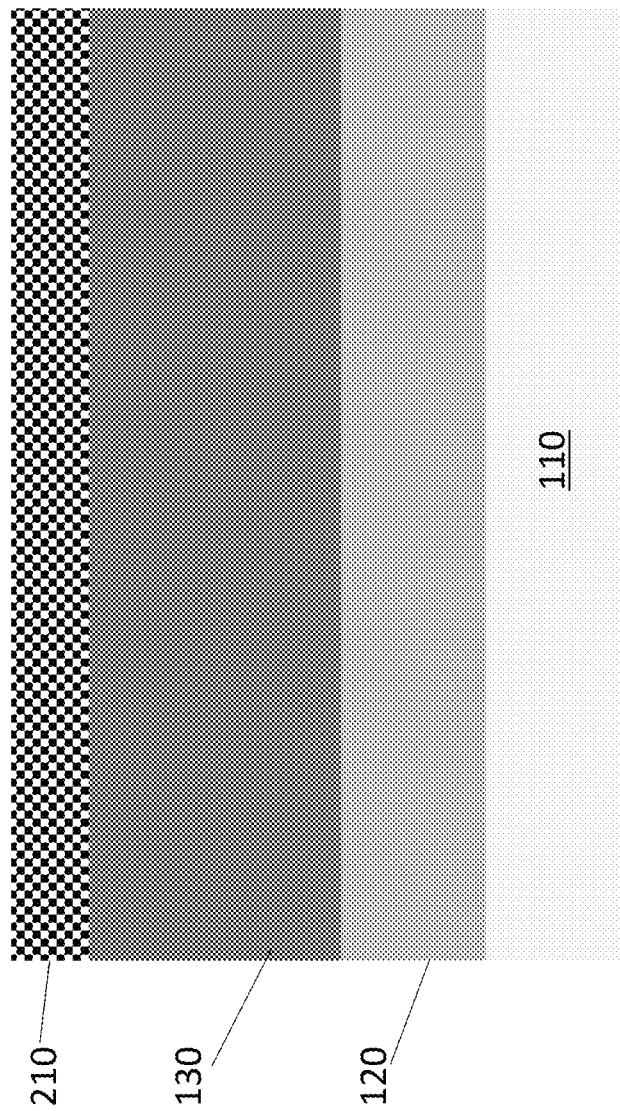
Figure 3:
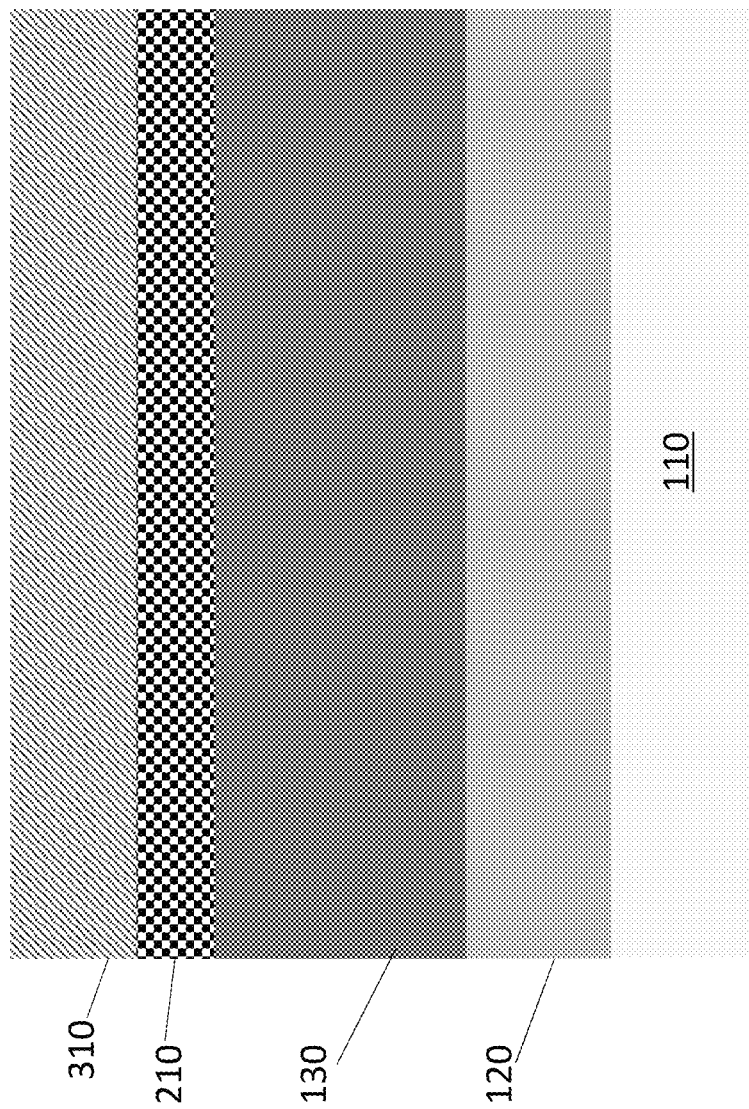

FIG. 2 shows the result of forming a base 210 on the collector 130. The base 210 is an in situ doped epitaxial silicon germanium (SiGe) layer or, in alternate embodiments, an in situ doped epitaxial silicon germanium carbide (SiGeC) layer that can be 10 to 20 nanometers thick, for example. The base 210 may be 10% to 60% Ge and doped with boron ions (B+) with a concentration of approximately 2 to $5e^{19}$ cm'. A hardmask 310 is formed on the base 210 to form the intermediate structure shown in FIG. 3. The hardmask 310 is used for fin formation in subsequent processes. In an exemplary embodiment, the hardmask 310 is silicon nitride (SiN).

Figure 4:
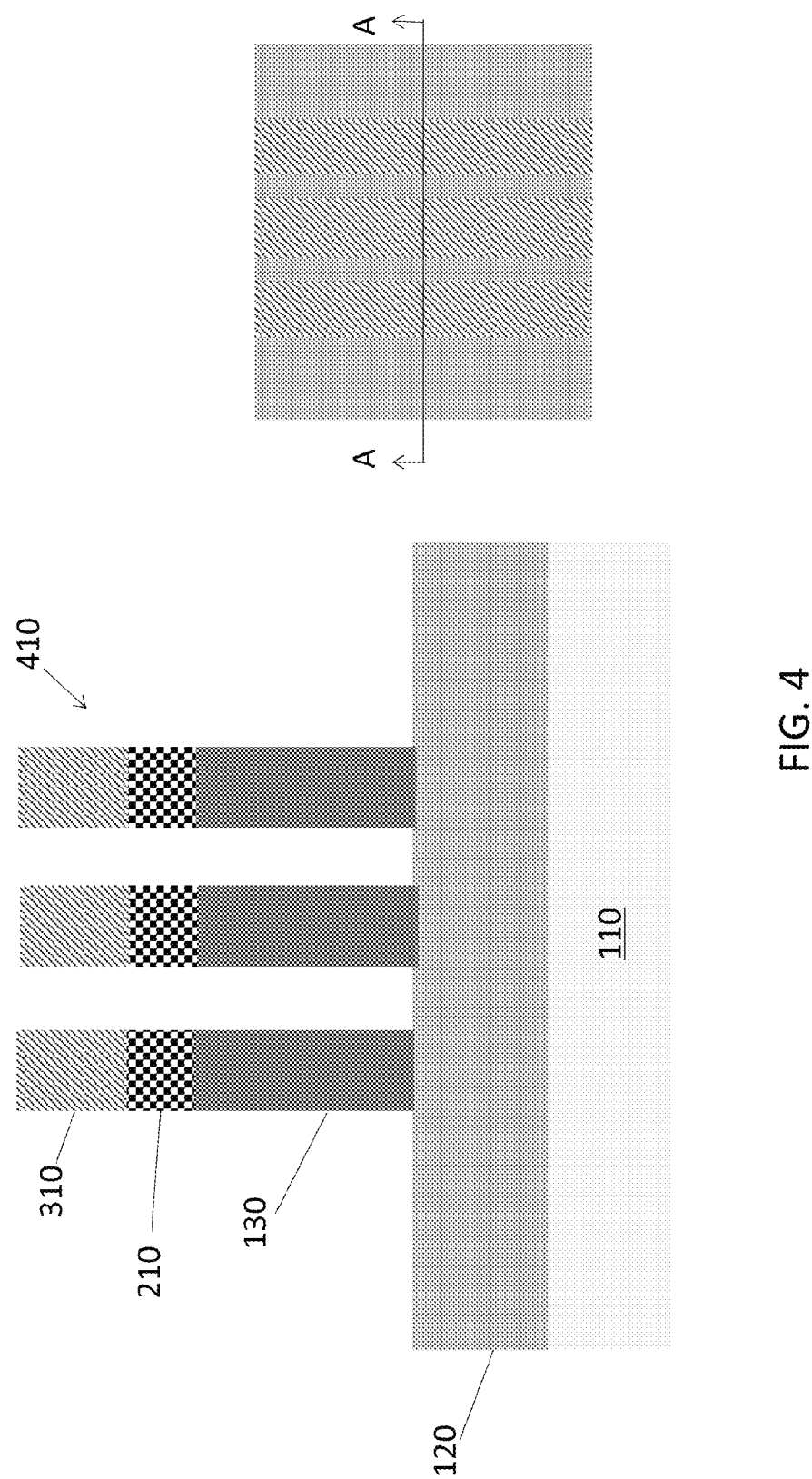
Figure 5:
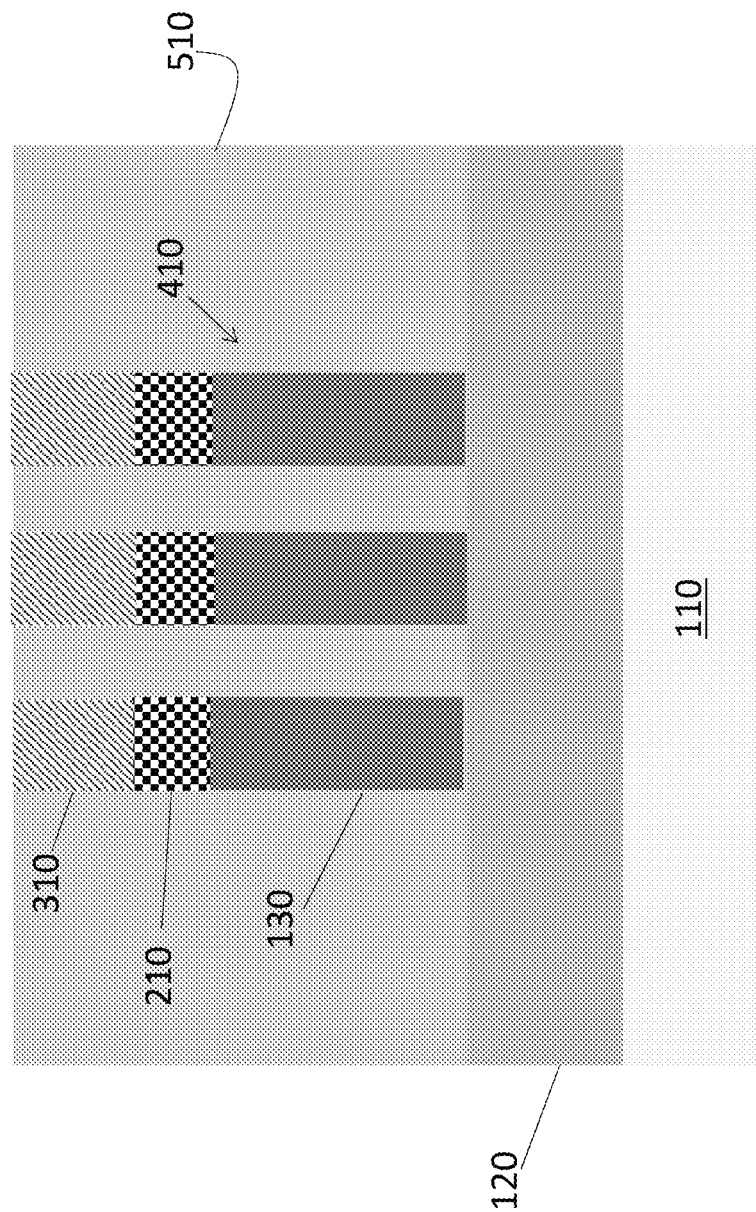

FIG. 4 shows the result of patterning fin 410 using a reactive ion etch (RIE) process. The collector 130, base 120, and hardmask 310 are patterned on the sub-collector 120. FIG. 4 also shows a top view that indicates the cross-sectional cut A-A that shows the fins 410. FIG. 5 is a cross-sectional view across the fins 410 that shows the intermediate structure that results from oxide 510 deposition. The deposition can be followed by a chemical-mechanical planarization (CMP) process. The oxide 510 is a high density oxide, for example.

Figure 6:
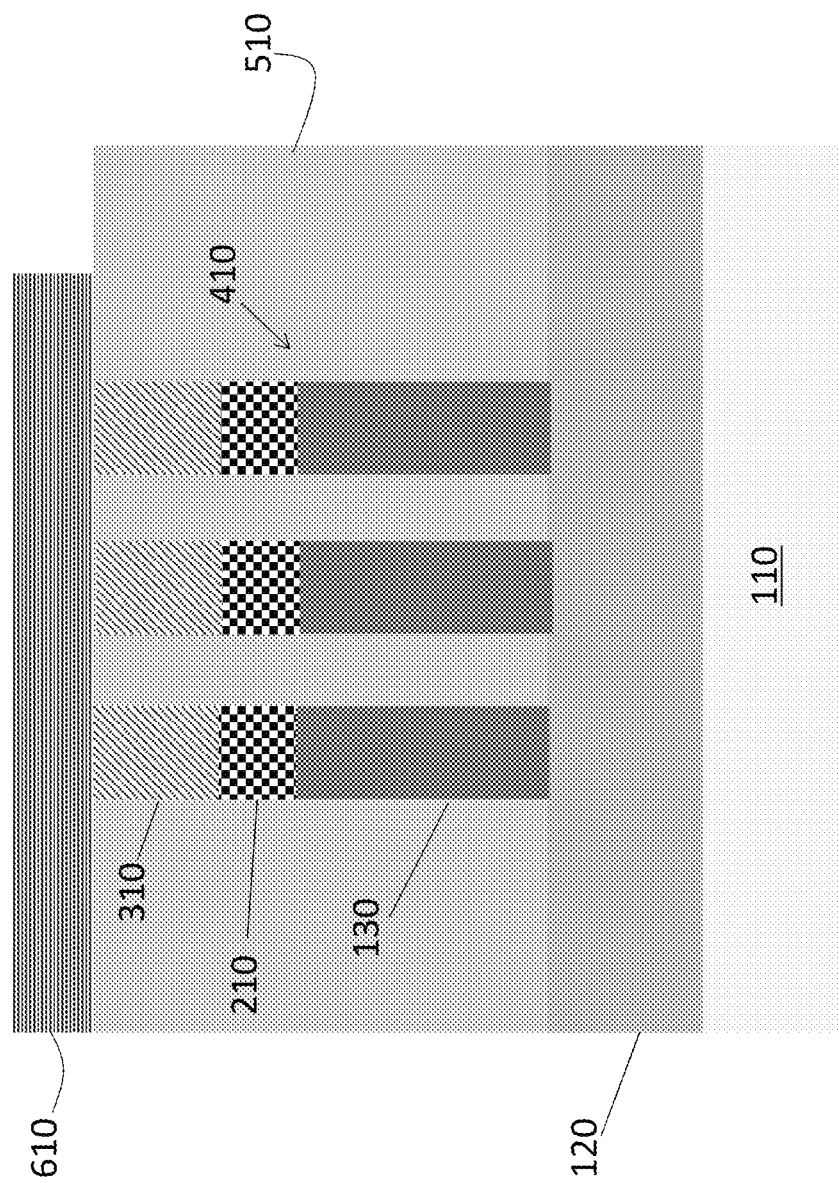
Figure 7:
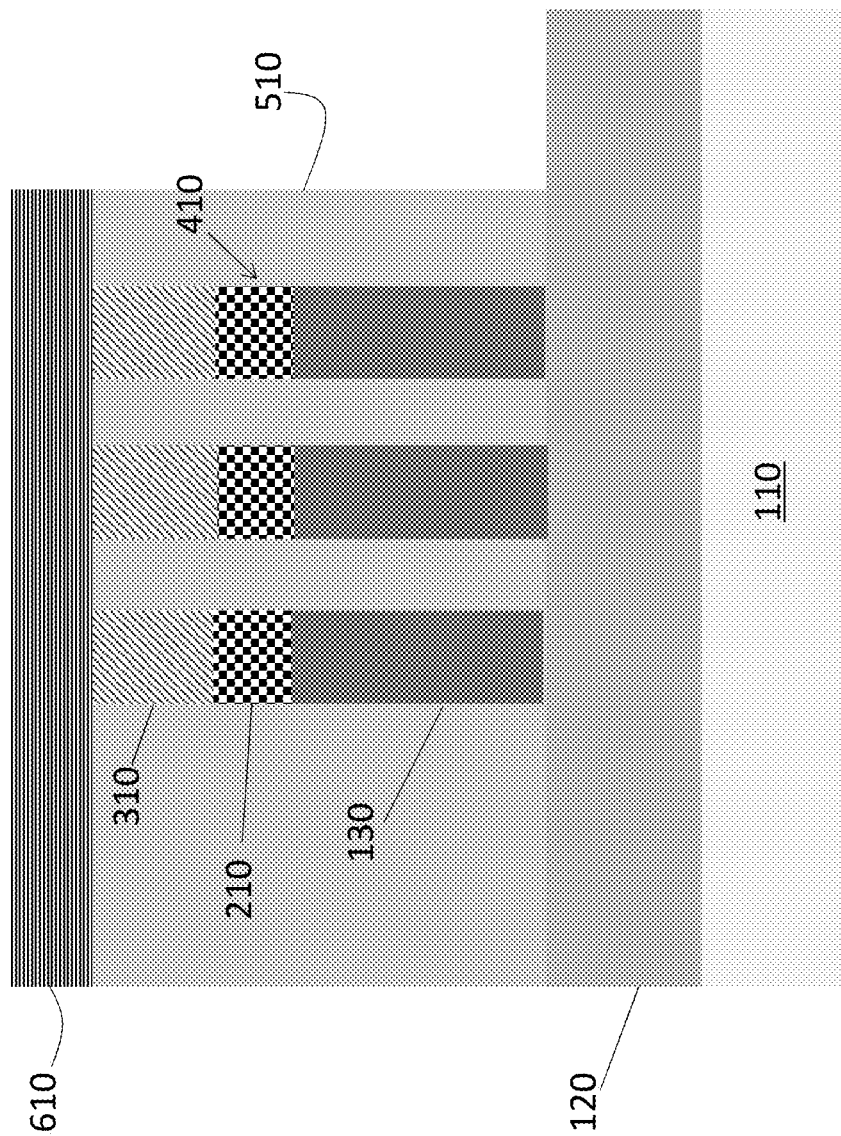

FIG. 6 is a cross-sectional view across the fins that shows a lithographic mask 610 formed on the fins 410 and on most of the oxide 510 layer. The oxide 510 portion that is exposed after deposition of the mask 610 has a portion of the sub-collector 120 below. FIG. 7 shows the result of an etch of the exposed oxide 510 down to the sub-collector 120 below. An ME process is used in conjunction with the mask 610 to perform the etch. The portions below the mask 610 are left unchanged.

Figure 8:
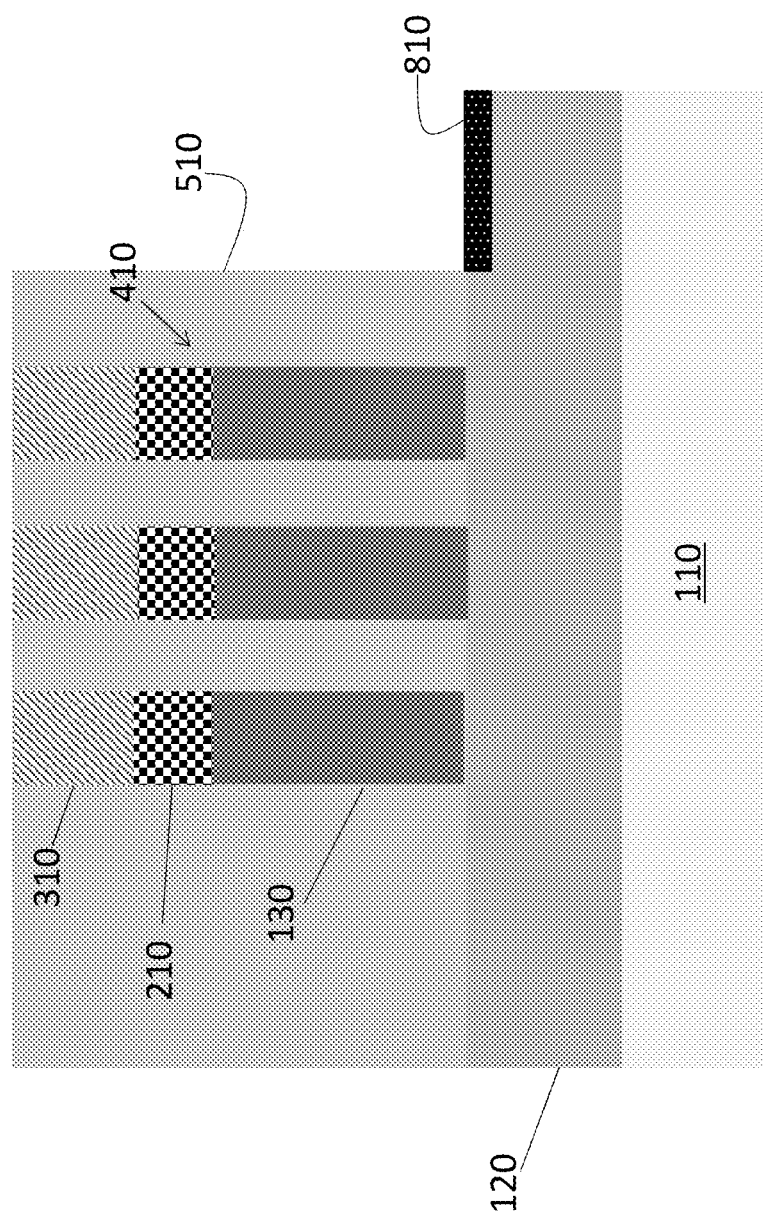
Figure 9:
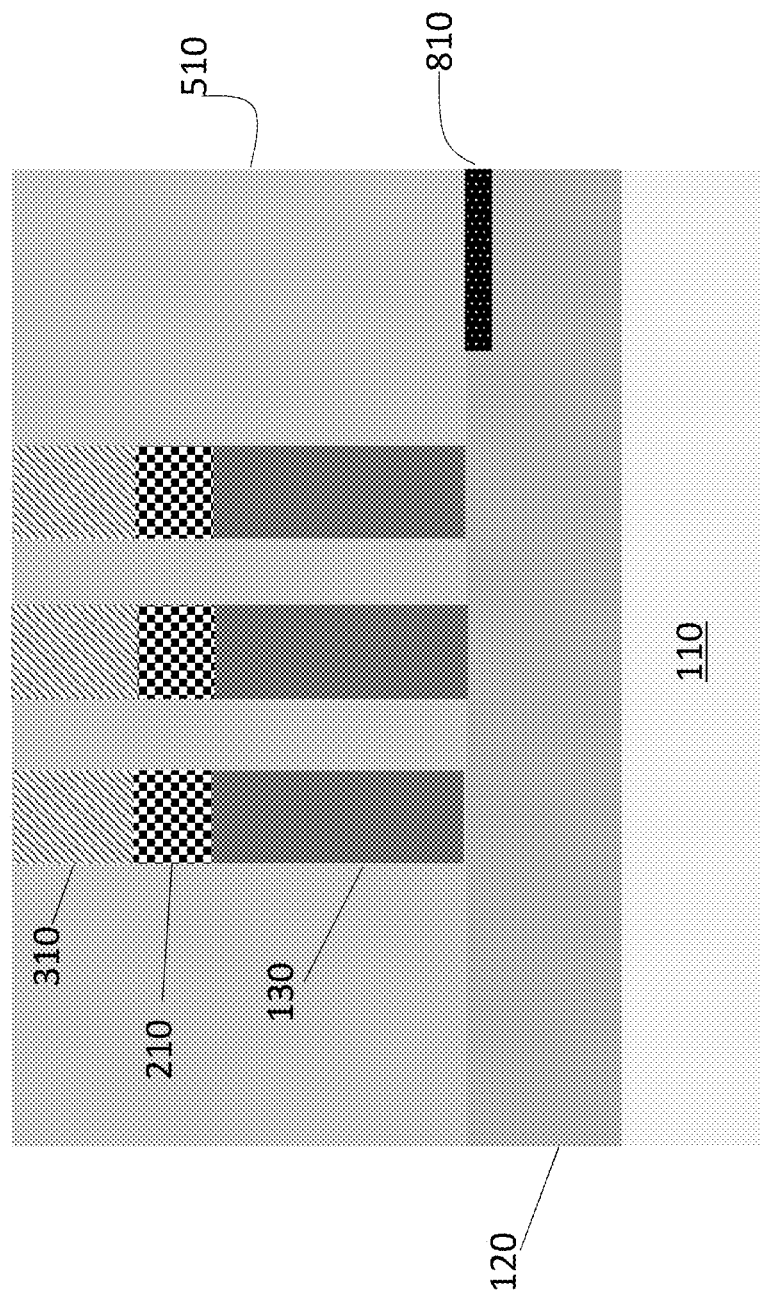

FIG. 8 results from stripping the mask 610 and forming a silicide 810 on the exposed portion of the sub-collector. The silicide 810 is formed from a sputter of titanium (Ti) or cobalt (Co) followed by an anneal. The sputtered material reacts with Si of the sub-collector 120 but not with the dielectric of the oxide 510. Following a rinse with hafnium (Hf), for example, the silicide 810 is formed on the exposed surface of the sub-collector 120. An oxide 510 fill then results in the intermediate structure shown in FIG. 9.

According to an alternate embodiment, the silicide 810 may be formed at the same time as the silicide 810 for the contacts 1710 (FIG. 17) above the emitter 1110 (FIG. 11) and base 210. Forming the silicide 810 at this stage instead facilitates forming a larger area of silicide 810 than would be possible at the stage shown in FIG. 17. This is because the silicide 810 formed at a later stage would be confined to a trench within the oxide 510. The larger area of silicide 810 facilitated by formation at this stage reduces contact resistance.

Figure 10:
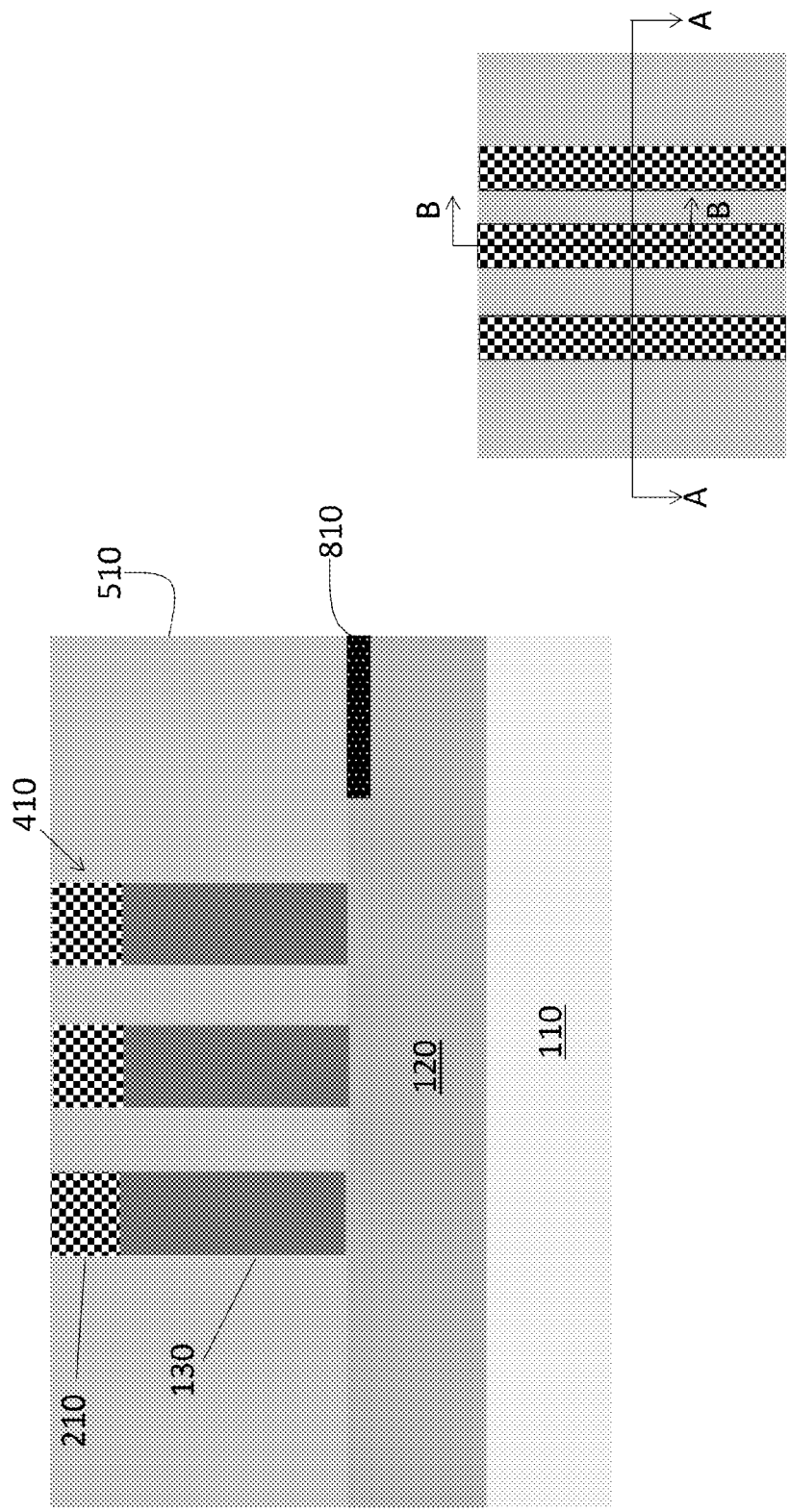
Figure 11:
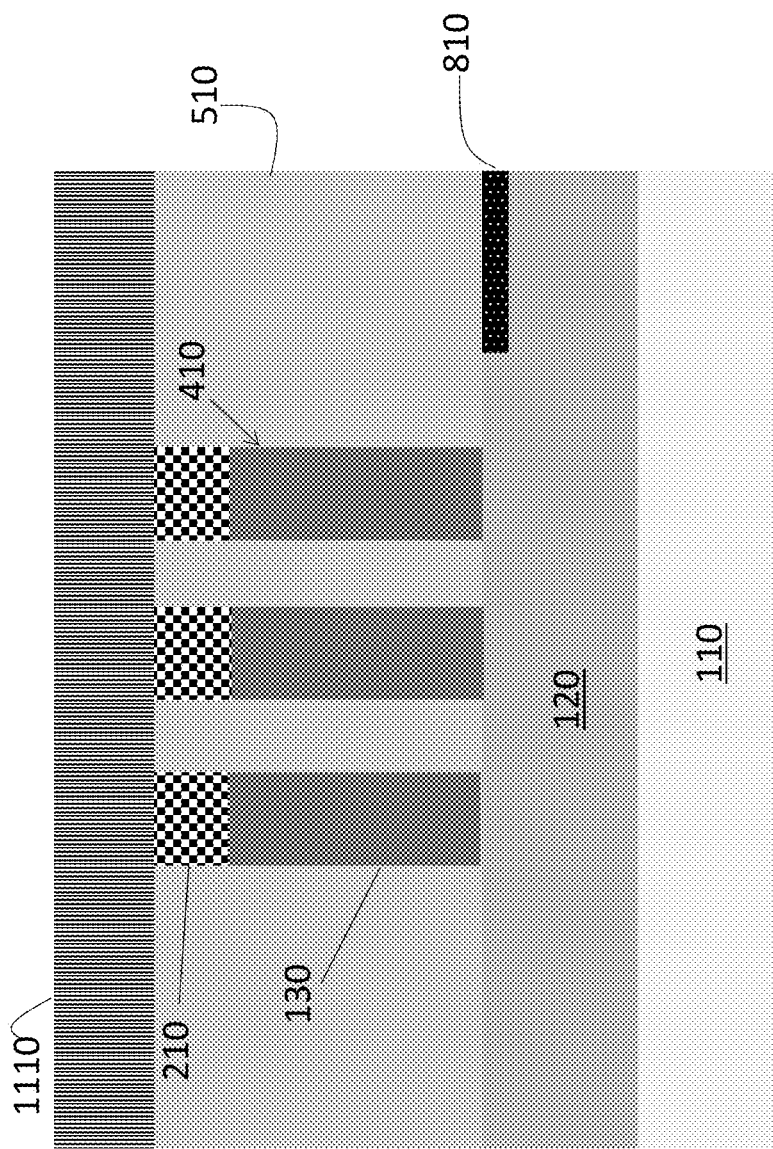

FIG. 10 shows a top view of the intermediate structure that results from recessing the oxide 510 and removing the hardmask 310. The top view indicates that the cross-sectional view shown in FIG. 10 is along A-A, which is across the fins 410. The collector 130 and base 210 form the fins 410 shown in FIG. 10. FIG. 11 is the cross-sectional view along A-A of an intermediate structure that results from formation of an emitter 1110 on the fins 410 and oxide 510. The emitter 1110 is formed on top of the base fins as shown. The emitter 1110 is an epitaxially grown Si layer that is heavily in-situ doped or ion implanted with As (n-type doping). The heavy doping or ion implantation results in a good P-N junction between the base 210 and emitter 1110. The concentration of As in the emitter 1110 is in the range of $2e^{19}$ to $5e^{20}$ cm$^{-3}$.

Figure 12:
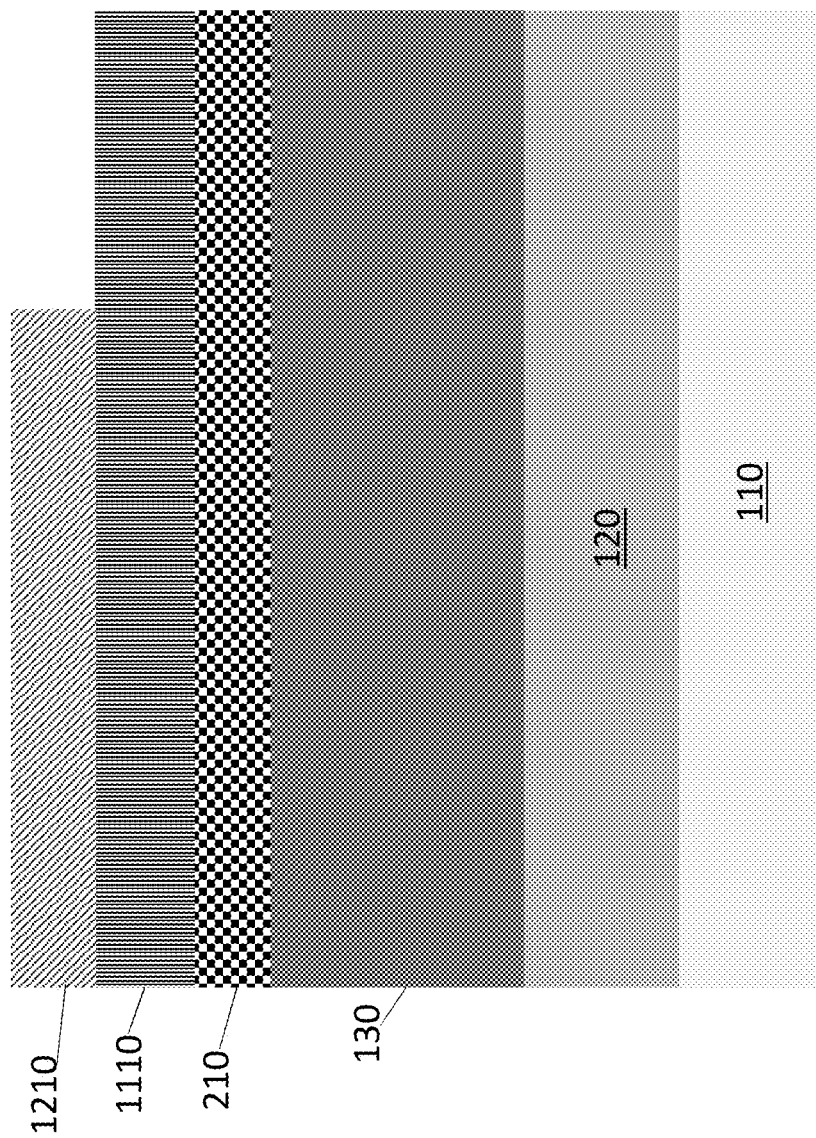
Figure 13:
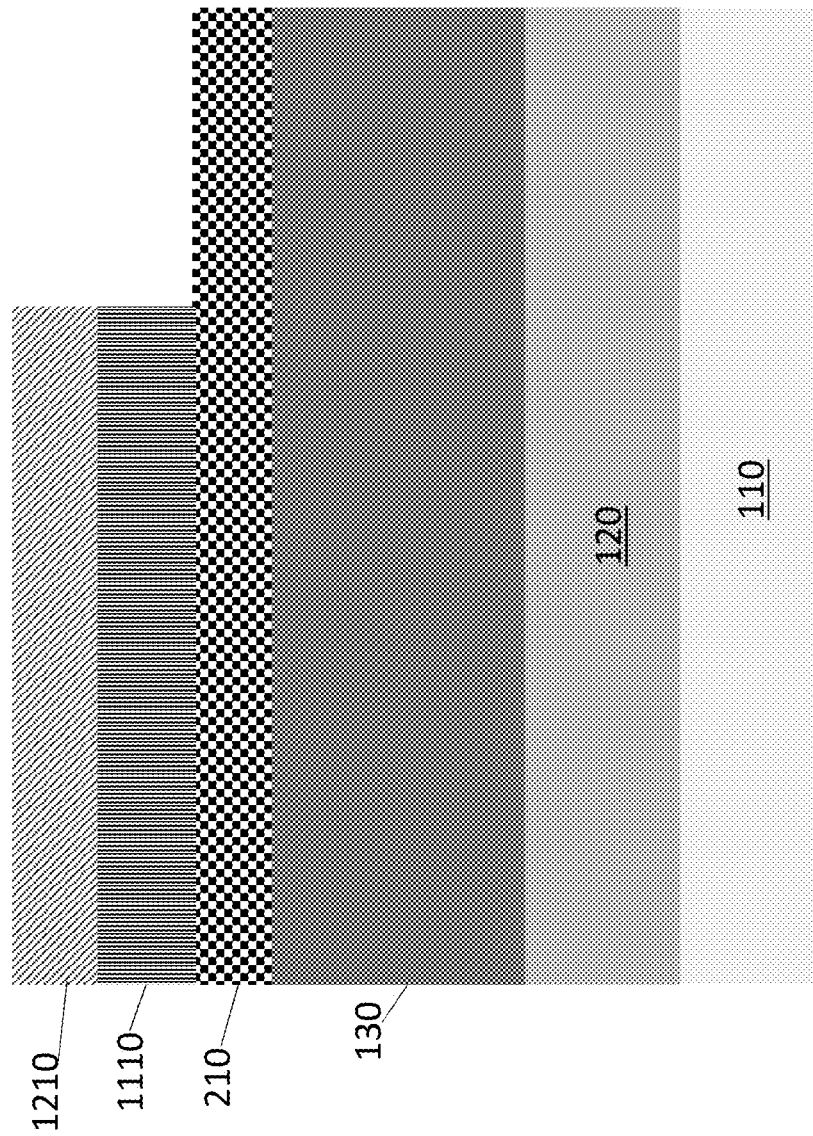

FIG. 12 is a cross-sectional view along B-B of an intermediate structure resulting from deposition of a lithographic mask 1210 over part of the emitter 1110 layer. This results in a portion of the emitter 1110 being exposed. The view along B-B shows a cross sectional view along a fin 410, as indicated by the top view in FIG. 10. FIG. 13 is a cross-sectional view along B-B that shows the intermediate structure resulting from an etch of the exposed portion of the emitter 1110. The etch is accomplished by an RIE process, for example.

Figure 14:
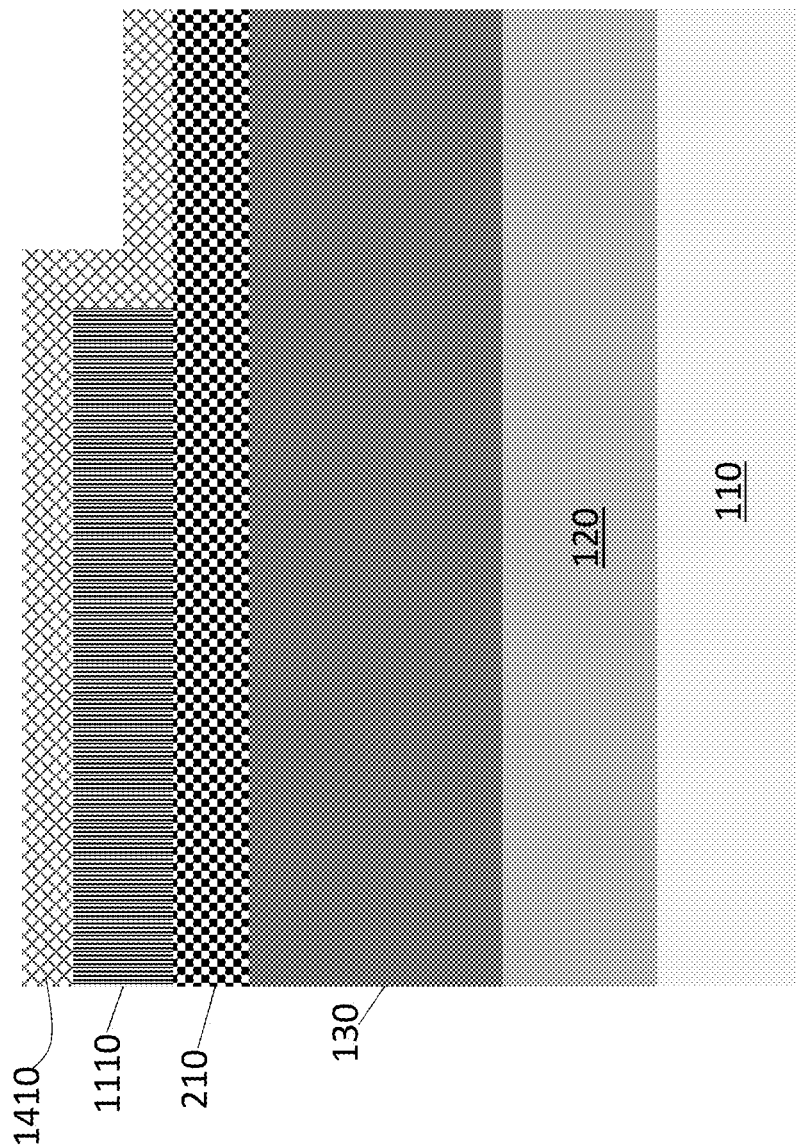
Figure 15:
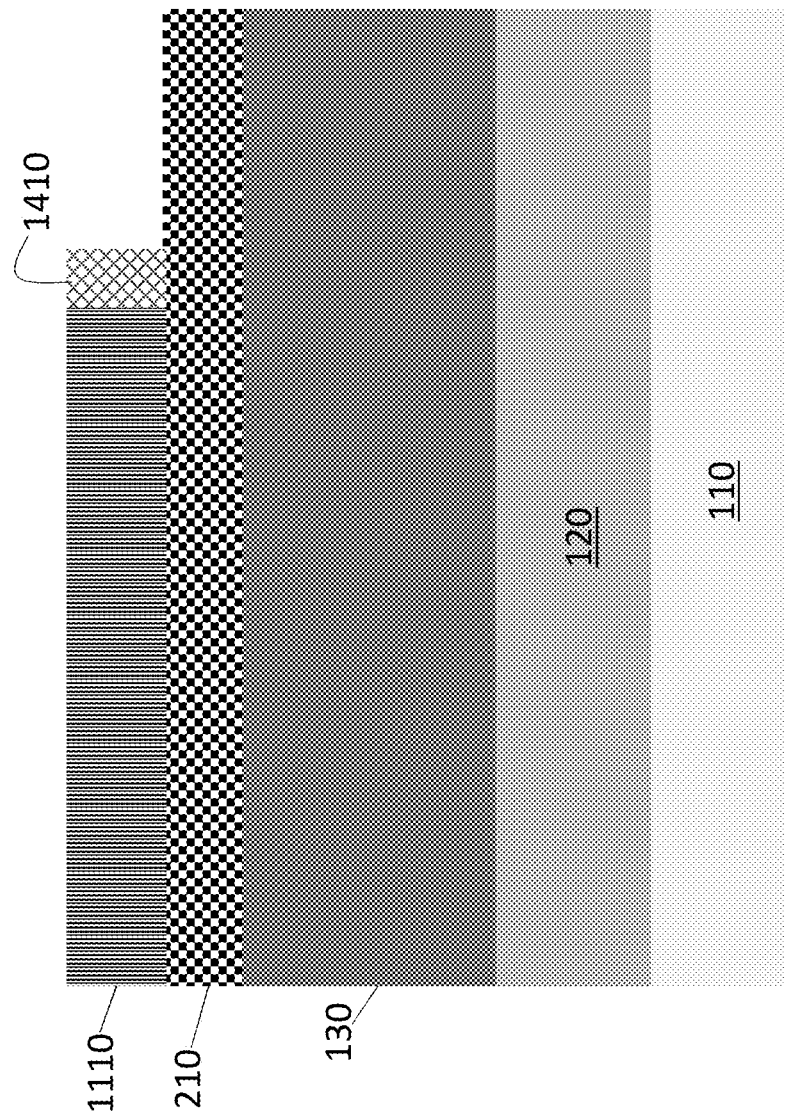
Figure 16:
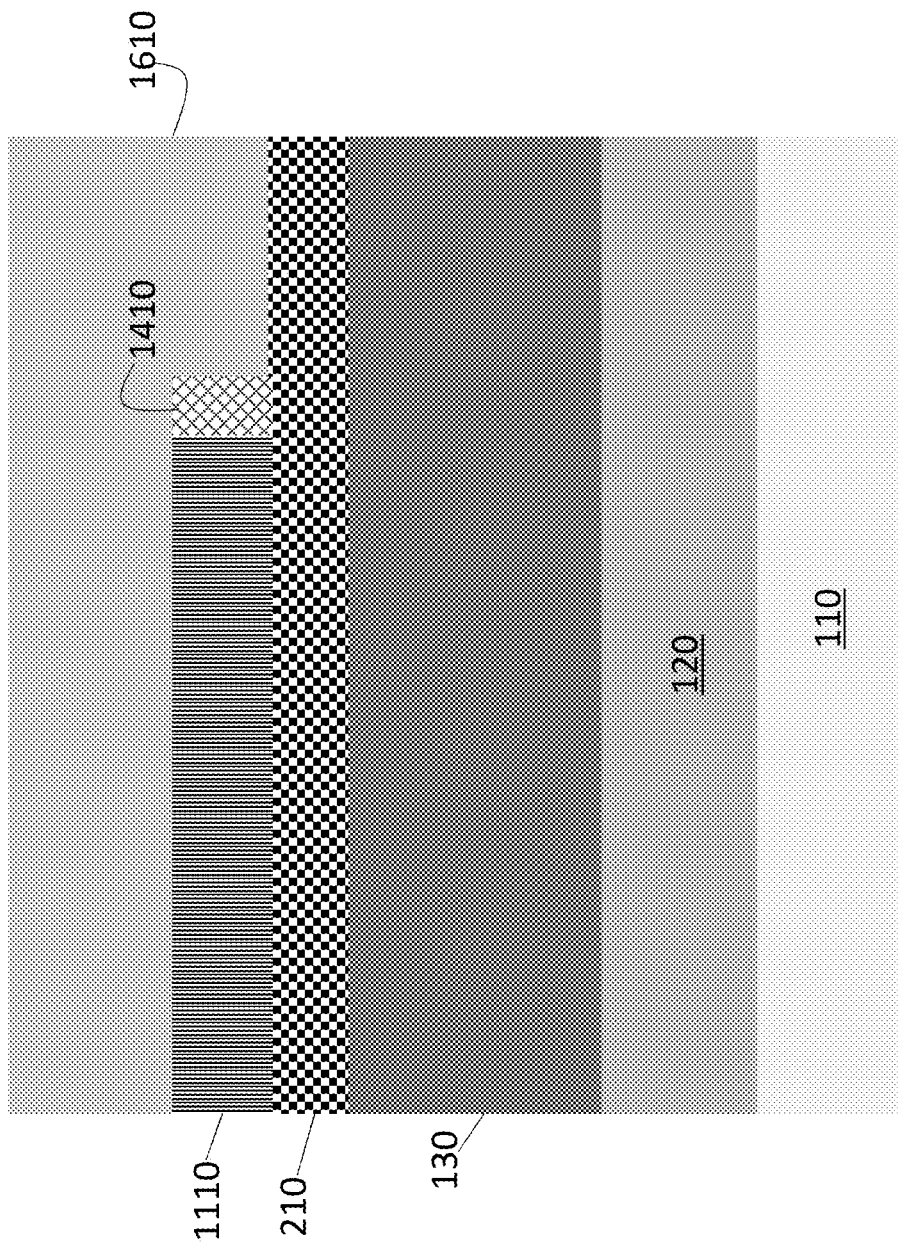

FIG. 14 is a cross-sectional view along B-B following conformal formation of an oxide spacer 1410 over the patterned emitter 1110 and exposed base 210. The spacer 1410 is SiN, for example. In alternate embodiments, the spacer 1410 is silicon dioxide ($SiO_2$). FIG. 15 shows a result of etching the spacer 1410 to leave only a portion adjacent to the emitter 1110. The cross-sectional view in FIG. 15 is along a fin 410 (along B-B, shown in FIG. 10), as well. FIG. 16 is a cross-sectional view along B-B that shows an intermediate structure resulting from deposition of oxide 1610 as an interlayer dielectric (ILD). The ILD oxide 1610 and the oxide 510 can be the same material.

Figure 17:
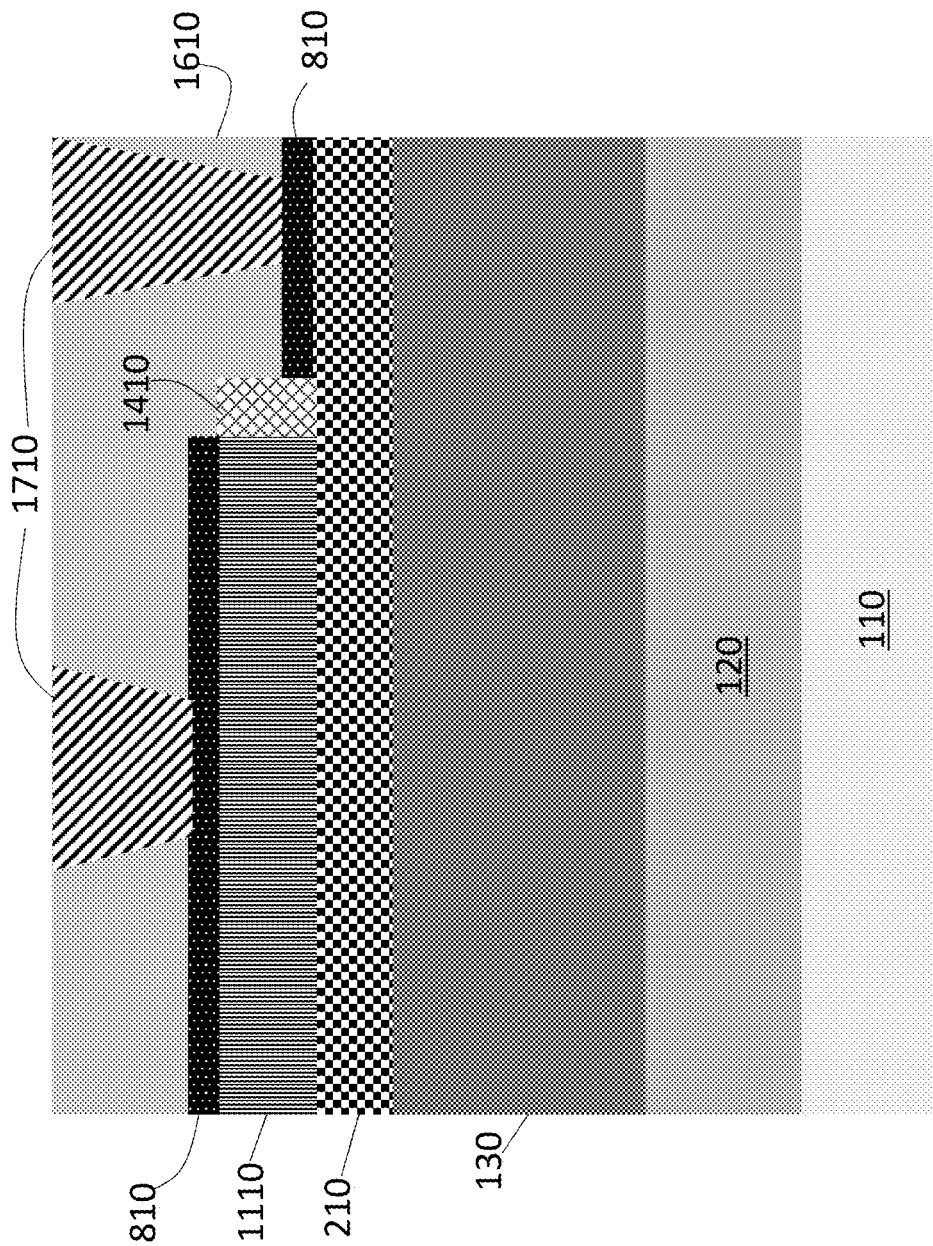
Figure 18:
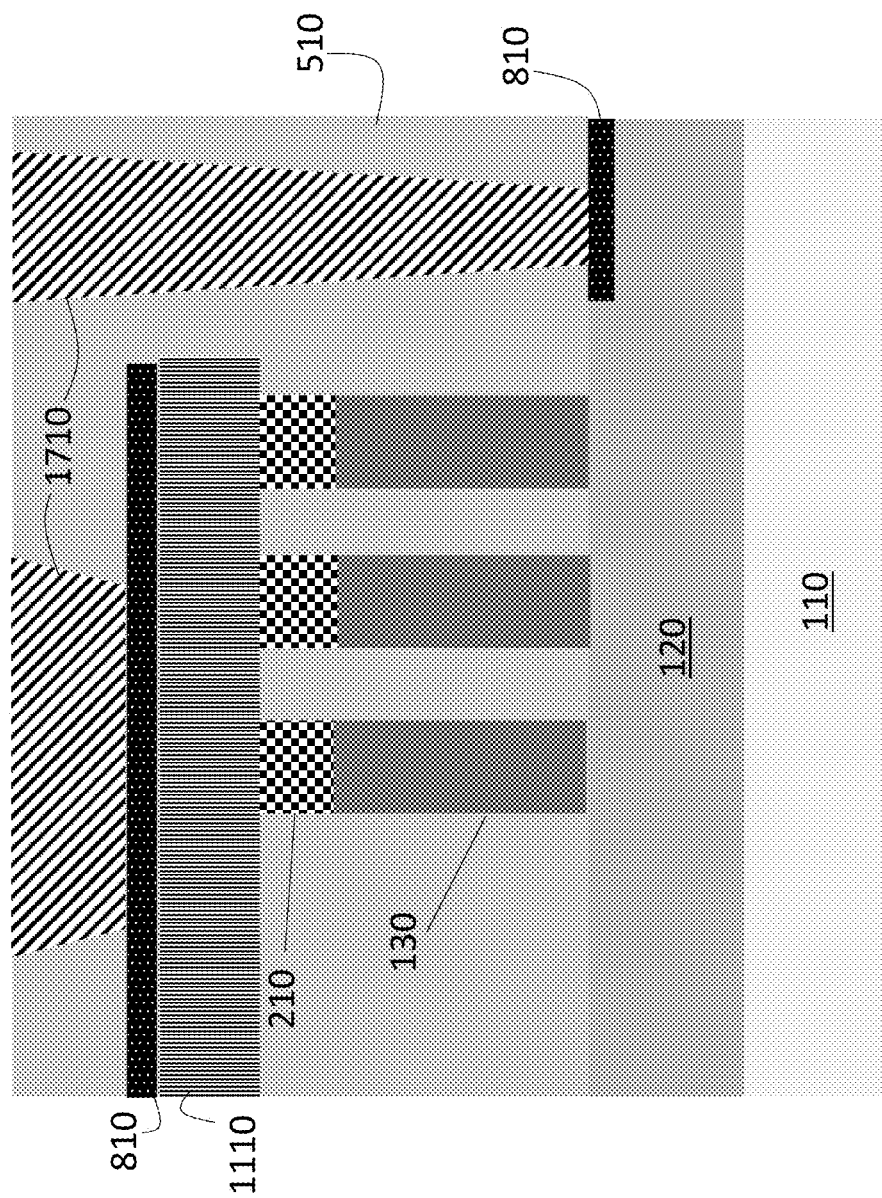
Figure 19:
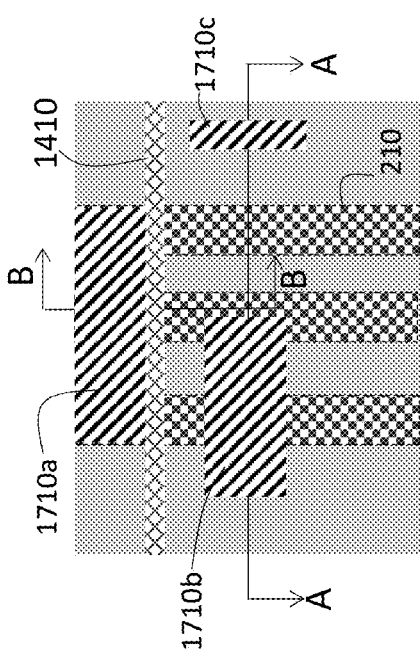

FIGS. 17, 18, and 19 show different views of the same structure. FIG. 17 is a cross-sectional view along a fin 410 (along B-B according to the top view shown in FIG. 10). The contacts 1710 formed above the emitter 1110 and base 210 are visible in the view shown in FIG. 17. The contacts 1710 are within vias that are formed in the oxide 1610. The known processes for forming vias are not detailed herein. Silicide 810 is formed on the surface of the emitter 1110 and base 210, and the contacts 1710 are formed on the silicide 810 layers, as shown. An N-P-N bipolar transistor is shown. The extended emitter 1110 layer shown in FIG. 17 facilitates improved current handling capability. FIG. 18 shows a cross-sectional view across the fins 410 (along A-A). The contacts 1710 above the emitter 1110 and sub-collector 120 are shown in the view of FIG. 18.

FIG. 19 is a top view of the same structure shown in FIGS. 17 and 18 and indicates the cuts A-A and B-B across the fins 410 and along a fin 410, respectively, and the contacts 1710. The base 210 is indicated through the oxide 510 that covers the device. The contact 1710a is for the base 210, the contact 1710b is for the emitter 1110, and the contact 1710c is for the sub-collector 120. The silicide 810 formed on the sub-collector 120 is not visible in the top view due to the oxide 510 above.

Figure 20:
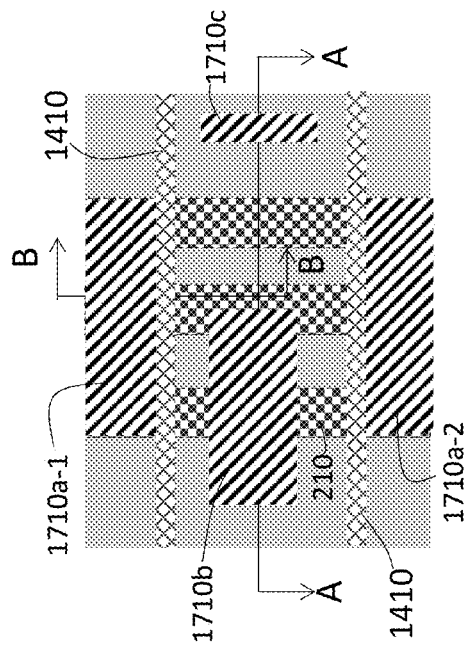

FIG. 20 is a top view of another embodiment of the structure shown in FIG. 19. Because the base 210 is part of the fin structure that extends from one end of the device to the other, two contacts 1710a-1 and 1710a-2 can be formed symmetrically to the base 210. Two oxide spacers 1410 are also formed in this embodiment to separate the base 210 contacts 1710a-1 and 1710a-2 from the emitter 1110. By increasing the contact area by having two contacts 1710a-1 and 1710a-2, contact resistance is reduced.

As previously discussed, the bipolar transistor fabricated as shown in FIGS. 1-20 avoids the issues of prior approaches. For example, the emitter is not formed as part of the fin structure but, instead, as a continuous layer. This avoids the need for a side gate for the base contact. Additionally, RTA is not relied on to diffuse dopant and form the base. As another difference, the fins are not entirely comprised of SiGe according to the one or more embodiments detailed herein. Instead, only the base portion of the fins is SiGe. Based on the several features detailed herein, the bipolar transistor fabricated according to the one or more embodiments does not suffer from degraded performance. As also noted previously, the bipolar transistor, fabricated according to the embodiments detailed herein, can be integrated with a vertical CMOS as well as a horizontal CMOS in a BiCMOS device as part of a SoC.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a fin heterojunction bipolar transistor (fin HBT) for integration with a fin complimentary metal-oxide-semiconductor (fin CMOS) into a BiCMOS fin device, the method comprising:
    forming a sub-collector layer on a substrate, the sub-collector layer of the bipolar transistor of the BiCMOS fin device comprising silicon doped with arsenic (As+);
    patterning a collector layer and base as fins along a first direction, the base of the bipolar transistor of the BiCMOS fin device comprising silicon germanium (SiGe) or silicon germanium carbide (SiGeC);
    forming an emitter layer on the fins, the emitter layer of the bipolar transistor of the BiCMOS fin device comprising a continuous layer of epitaxially grown silicon; and
    depositing an oxide above the sub-collector layer, the base, and the emitter layer; and
    forming at least one contact through the oxide to each of the sub-collector layer, the base, and the emitter layer.

2. The method according to claim 1, further comprising doping the SiGe or SiGeC of the base with boron ions (B+).

3. The method according to claim 1, further comprising patterning the emitter layer to etch portions of the emitter layer that are at each end of the fins in the first direction, wherein the patterning exposes a contact portion of the base of the fins at each end in the first direction.

4. The method according to claim 3, wherein the forming the at least one contact to the base is at the contact portion of the base at one end of the fins in the first direction.

5. The method according to claim 4, further comprising forming a second contact to the base is at the contact portion at another end of the fins in the first direction.

6. The method according to claim 3, further comprising forming an oxide spacer between the emitter layer and each of the one or more contacts to the base.

7. The method according to claim 1, further comprising patterning the emitter layer to etch a portion adjacent to the fins in a second direction that is perpendicular to the first direction, wherein the patterning exposes a contact portion of the sub-collector layer.

8. The method according to claim 7, wherein the forming at least one contact to the sub-collector layer is in the contact portion of the sub-collector layer.

9. The method according to claim 1, further comprising forming a silicide directly on the sub-collector layer, the base, and the emitter layer.

10. The method according to claim 9, wherein the forming the at least one contact to each of the sub-collector layer, the base, and the emitter layer is directly on the respective silicide.

11. A fin heterojunction bipolar transistor (fin HBT) integrated with a fin complimentary metal-oxide-semiconductor (fin CMOS) into a BiCMOS fin device, the device comprising:
    a sub-collector layer formed on a substrate, the sub-collector layer comprising silicon doped with arsenic (As+);
    a collector layer and a base patterned as fins along a first direction, the base comprising silicon germanium (SiGe) or silicon germanium carbide (SiGeC);
    an emitter layer formed on the fins, the emitter layer comprising epitaxially grown silicon; and
    at least one contact above each of the sub-collector layer, the base, and the emitter layer.

12. The fin HBT according to claim 11, wherein a concentration of dopant in the sub-collector layer is $2e^{19}$ to $1e^{20}$ (1/centimeter$^3$).

13. The fin HBT according to claim 11, wherein the base includes 10 to 60% Ge and is doped with boron ions (B+).

14. The fin HBT according to claim 11, wherein the emitter layer is patterned such that a contact portion of the base of the fins is exposed at each end in the first direction.

15. The fin HBT according to claim 14, wherein the at least one contact above the base is formed in the contact portion at one end of the fins in the first direction.

16. The fin HBT according to claim 15, wherein a second contact above the base is formed in the contact portion at another end of the fins in the first direction.

17. The fin HBT according to claim 14, further comprising an oxide spacer between the emitter layer and each of the one or more contacts above the base.

18. The fin HBT according to claim 11, wherein the emitter layer is patterned adjacent to the fins in a second direction that is perpendicular to the first direction such that a contact portion of the sub-collector layer is exposed.

19. The fin HBT according to claim 18, wherein the at least one contact above the sub-collector layer is in the contact portion of the sub-collector layer.

20. The fin HBT according to claim 11, further comprising a silicide formed on each of the sub-collector layer, the base, and the emitter layer such that each of the one or more contacts is formed directly on the silicide.

* * * * *